(12) United States Patent
Yamawaki et al.

(10) Patent No.: US 7,515,648 B2
(45) Date of Patent: Apr. 7, 2009

(54) TRANSMITTER AND WIRELESS COMMUNICATION APPARATUS USING SAME

(75) Inventors: Taizo Yamawaki, Tokyo (JP); Masahiro Ito, Kokubunji (JP); Masumi Kasahara, Takasaki (JP); Hiroaki Matsui, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 542 days.

(21) Appl. No.: 11/017,076

(22) Filed: Dec. 21, 2004

(65) Prior Publication Data

US 2005/0220217 A1    Oct. 6, 2005

(30) Foreign Application Priority Data

Mar. 31, 2004    (JP) .............................. 2004-102561

(51) Int. Cl.
    *H04K 1/02* (2006.01)
(52) U.S. Cl. ...................... 375/297; 375/295; 375/219; 375/316; 375/298; 455/552.1
(58) Field of Classification Search ................. 375/295, 375/298; 455/552.1
    See application file for complete search history.

(56) References Cited

U.S. PATENT DOCUMENTS

| | | | | |
|---|---|---|---|---|
| 4,086,540 A | * | 4/1978 | Delagrange | 327/558 |
| 5,586,146 A | * | 12/1996 | Fang et al. | 375/295 |
| 5,784,412 A | * | 7/1998 | Ichihara | 375/302 |
| 5,787,362 A | * | 7/1998 | Matero | 455/553.1 |
| 6,518,859 B1 | * | 2/2003 | Spampinato | 333/174 |
| 6,686,799 B2 | * | 2/2004 | Ivry | 327/560 |
| 2002/0159503 A1 | * | 10/2002 | Ramachandran | 375/146 |
| 2003/0003952 A1 | * | 1/2003 | Kim | 455/552 |
| 2003/0048834 A1 | * | 3/2003 | Feher | 375/219 |
| 2003/0092416 A1 | | 5/2003 | Tanaka et al. | 455/323 |
| 2004/0137862 A1 | | 7/2004 | Tanaka et al. | 455/127.3 |
| 2005/0014476 A1 | | 1/2005 | Oono et al. | 455/118 |

FOREIGN PATENT DOCUMENTS

| | | |
|---|---|---|
| JP | 07-193430 | 7/1995 |
| JP | 2003-152563 | 5/2003 |
| JP | 2003-152815 | 5/2003 |
| WO | WO2004/057768 | 7/2004 |

* cited by examiner

*Primary Examiner*—Shuwang Liu
*Assistant Examiner*—Lihong Yu
(74) *Attorney, Agent, or Firm*—Miles & Stockbridge P.C.

(57) ABSTRACT

A transmitter that can reduce noise without using an SAW filter whose IC integration is hard, and copes with two modulation formats of constant envelope modulation and non-constant envelope modulation, and a downsized and low-cost wireless communication apparatus that uses the transmitter are provided. The transmitter includes a quadrature modulator that modulates an input signal by quadrature modulation, a first amplifier that amplifies a modulation signal outputted by the quadrature modulator, and a second amplifier that amplifies an output signal of the first amplifier. The first amplifier operates as a limiter when the modulation format is the constant envelope modulation, and performs linear operation when the modulation format is the non-constant envelope modulation.

1 Claim, 10 Drawing Sheets

TRANSMITTER AND WIRELESS COMMUNICATION APPARATUS USING SAME

CLAIM OF PRIORITY

The present application claims priority from Japanese application JP 2004-102561 filed on Mar. 31, 2004, the content of which is hereby incorporated by reference into this application.

FIELD OF THE INVENTION

The present invention relates to a wireless communication apparatus that copes with two types of communication methods whose modulation formats are constant envelope modulation and non-constant envelope modulation, and copes with at least one frequency band, and relates to a transmitter used in the wireless communication apparatus.

BACKGROUND OF THE INVENTION

Wireless communication has increased explosively in the number of subscribers centering around a voice service during the last ten years. An example of such a communication system includes a GSM (Global System for Mobile Communications). On the other hand, in recent years, the needs for high speed data communication as well as the voice service have been increasing. Also in the GSM, a method that uses conventional GMSK (Gaussian Minimum Shift Keying) modulation which is constant envelope modulation is being scheduled to shift to an EDGE (Enhanced Data for Global Evolution) method that uses 8-level PSK (Phase Shift Keying) modulation which is multi-level modulation and non-constant envelope modulation. An apparatus that copes with this EDGE method must be a dual mode apparatus that copes with two methods of a conventional GSM method (constant envelope GMSK modulation) and an EDGE method (non-constant envelope 8-level PSK modulation).

An example of a transmitter that can cope with two modulation formats of these constant envelope modulation and non-constant envelope modulation is disclosed in a Patent document 1.

[Patent Document 1] JP-A No. 193430/1995

SUMMARY OF THE INVENTION

Figure 11:
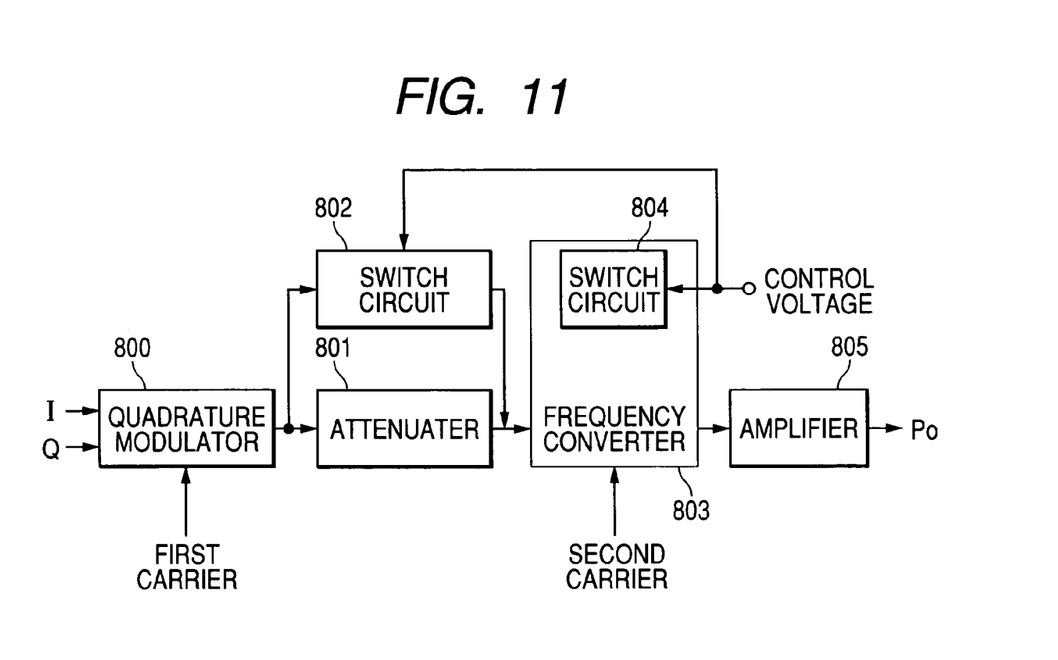
FIG. 11 is a block diagram for describing an example of a conventional transmitter.

FIG. 11 is a block diagram showing the typical configuration. A transmitter principally includes a quadrature modulator 800 that converts the center frequency of baseband signals I and Q that are orthogonal components mutually into a first carrier frequency, a frequency converter 803 that converts the first carrier frequency into a desired output frequency using a second carrier, and an amplifier 805 that amplifies an output signal of the frequency converter 803.

When non-constant envelope modulation signal is transmitted, information is loaded on the amplitude component. Accordingly, the quadrature modulator 800, an attenuator 801, the frequency converter 803, and the amplifier 805 are designed so that all these units can operate in a linear region.

On the other hand, when constant envelope modulation signal is transmitted, the following operation is performed in order to reduce a modulation error caused by an unwanted amplitude component. A switch circuit 802 reduces the quantity of attenuation of the attenuator 801 by allowing a control voltage to be supplied. Accordingly, an input signal level into the frequency converter 803 increases, and the frequency converter 803 operates in a saturation region, then amplitude is restricted. Moreover, a switch circuit 804 reduces a bias current of the frequency converter 803 by allowing the control voltage to be supplied, and decreases a degree of amplification of the frequency converter 803. Accordingly, the switch circuit 804 adjusts an output level of the frequency converter 803 so as to become equal before switching, and makes the frequency converter 803 generate an amplitude limiter action.

In the example of Patent Document 1, a method for converting a frequency in two stages is used. Accordingly, two high-noise frequency conversion circuits (the quadrature modulator 800 and the frequency converter 803) and two carrier generation circuits are required respectively, and a noise level in the transmitter output is not prevented from increasing. Moreover, in the attenuator 801, a signal-to-noise ratio (hereinafter referred to as "S/N") deteriorates. Accordingly, a system (−162 dBc/Hz in the 20 MHz detuning from a transmitting frequency) whose noise specification is strict, such as a GSM, requires such an SAW (Surface Acoustic Wave) filter whose IC integration is hard at the output of the frequency converter 803 or the input and output of the frequency converter 803. Accordingly, the area of an apparatus and its cost are not prevented from increasing.

An object of the present invention is to provide a low-noise transmitter that copes with two modulation formats of constant envelope modulation and non-constant envelope modulation, and a wireless communication apparatus that uses the low-noise transmitter.

The transmitter of the present invention that attains the foregoing object includes a quadrature modulator that modulates an input signal by quadrature modulation, a first amplifier that amplifies a modulation signal the quadrature modulator outputs, and a second amplifier that amplifies an output signal of the first amplifier. The first amplifier operates as a limiter when a modulation format is constant envelope modulation, and performs linear operation when the modulation format is non-constant envelope modulation. Because the limiter operation and linear operation are switched, an attenuator need not be used between the quadrature modulator and the first amplifier. Accordingly, the deterioration of the S/N caused by using the attenuator can be prevented. Furthermore, because noise is reduced that is caused by direct conversion in which frequency conversion is performed at a time by the quadrature modulator, a remarkably low-noise transmitter can be realized.

According to the present invention, a transmitter for a wireless communication apparatus that copes with a dual mode of constant envelope modulation format and non-constant envelope modulation format, and copes with at least one frequency band can be made into low noise.

BRIEF DESCRIPTION OF THE DRAWINGS

Preferred embodiments of the present invention will be described in detail based on the followings, wherein.

DETAILED DESCRIPTION OF THE PREFERRED EMBODIMENTS

The details of a transmitter according to the present invention and a wireless communication apparatus that uses the transmitter are further described below with reference to several embodiments shown in the drawings. Further, identical symbols in FIGS. 1, 5, 9, and 10 show identical or similar matters.

In an embodiment, a GSM that uses GMSK modulation as constant envelope modulation format is described adopting an EDGE system that uses 8-level PSK modulation as non-constant envelope modulation format. Needless to say, however, the description is not limited to these communication systems for actual implementation. For example, the GSM system, and a W-CDMA system can also be applied as the constant envelope modulation format and the non-constant envelope modulation format respectively.

Figure 1:
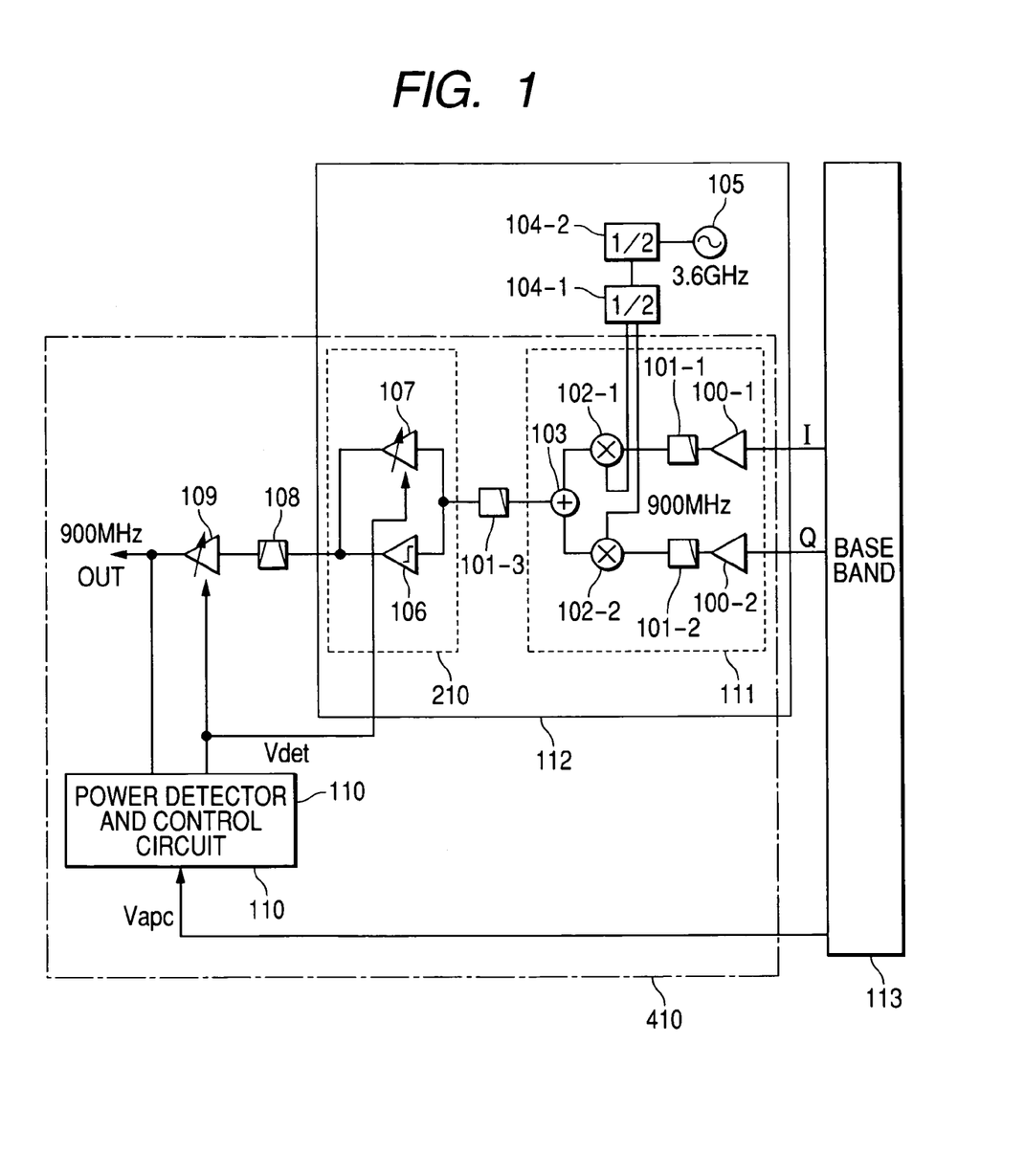
FIG. 1 is a block diagram for describing a first embodiment of a transmitter according to the present invention.

FIG. 1 is a block diagram showing a first embodiment of a transmitter according to the present invention. In FIG. 1, 111 is a quadrature modulator that modulates baseband signals I and Q input from a baseband circuit 113 by quadrature modulation, and outputs a desired radio frequency (hereinafter referred to as an "RF") modulation signal, and 101-3 is a low-pass filter (hereinafter referred to as an "LPF") that suppresses an unwanted noise of the RF modulation signal of the quadrature modulator 111. Also in FIG. 1, 106 is a limiter that limits the amplitude of the output signal of the LPF 101-3, and 107 is a variable gain amplifier (hereinafter referred to as a "VGA") that amplifies the output signal of the LPF 101-3 by linear operation. The VGA 107 and the limiter 106 are connected in parallel, and construct an output amplifier 210 that is a first amplifier. Furthermore, in FIG. 1, 108 is a band-pass filter (hereinafter referred to as a "BPF") that passes through a required frequency band of the output signal of the limiter 106 or the VGA 107, that is, the output signal of the output amplifier 210, and 109 is a power amplifier (hereinafter referred to as a "PA") that is a second amplifier that amplifies the output signal of the BPF 108, and 110 is a power detection and control circuit that controls a gain of the VGA 107.

The quadrature modulator 111 includes amplifiers 100-1 and 100-2, LPFs 101-1 and 101-2, mixers 102-1 and 102-2, and an adder 103. A local signal is supplied from a local signal generation circuit that includes a local oscillator 105 and ½ (one half) dividers 104-1 and 104-2 to the mixers 102-1 and 102-2. Moreover, the quadrature modulator 111, the local signal generation circuit, the LPF 101-3, the limiter 106, and the VGA 107 are integrated, and construct an RF-IC 112. Further, an output frequency of the local oscillator 105 is stabilized by a phase lock loop.

A transmitter 410 is constructed as described above including the quadrature modulator 111, the LPF 101-3, the output amplifier 210, the BPF 108, the power amplifier 109, and the power detection and control circuit 110.

Subsequently, the detailed operation of the transmitter 410 of this embodiment is described below. After the baseband signals I and Q input from the baseband circuit 113 to the MOD 111 allow a predetermined gain to be supplied by the amplifiers 100-1 and 100-2, and an unwanted noise to be suppressed by the LPF 101-1 and 101-2, the signals are input to the mixers 102-1 and 102-2. Further, the amplifiers 100-1 and 100-2 may also use an attenuator according to the levels of the baseband signals I and Q in some cases. The center frequency of the baseband signals I and Q is up-converted into the output signal frequency of the local signal generation circuit by the mixers 102-1 and 102-2.

In this embodiment, the local oscillator 105 oscillates at 3.6 GHz, and a local signal of 900 MHz is obtained by passing through the ½ dividers 104-1 and 104-2. Moreover, the ½ divider 104-1 also serves as a 90-degree phase shifter, and the local signal whose phase is mutually shifted by 90 degrees respectively is input to the mixers 102-1 and 102-2. The output signals of the mixers 102-1 and 102-2 are added together by the adder 103, and a desired RF modulation signal whose center frequency is 900 MHz is obtained. The RF modulation signal allows an unwanted noise to be suppressed by the LPF 101-3. The LPF 101-3 can be constructed with a filter described using FIG. 7 described in detail later, for example. Further, the LPF 101-3 is not limited to an LPF, but can be substituted even for a band-pass filter having a characteristic that passes through a desired frequency band. However, in this embodiment, a filter whose out-of-band attenuation is large, such as an SAW filter, need not be used.

In the GSM mode, the limiter 106 enters an operating state, and the VGA 107 enters a non-operating state. After the RF modulation signal allows a predetermined gain to be supplied by the limiter 106, the RF modulation signal is input to the BPF 108. Moreover, in the EDGE mode, the limiter enters the non-operating state, and the VGA 107 enters the operating state. After the RF modulation signal allows the gain to be supplied by the VGA 107, the RF modulation signal is input to the BPF 108.

The BPF 108 has a bandpass characteristic, and functions as establishing matching among the limiter 106, the VGA 107, and the power amplifier 109. Moreover, the BPF 108 may also be used for differential-to-single conversion. Furthermore, the BPF 108 may also serve as a load for the limiter 106 and the VGA 107. The BPF 108 can also be constructed with a filter described with reference to FIG. 8 described in detail later, for example. The output signal of the BPF 108 allows a gain to be supplied by the power amplifier 109, and is input as an output signal OUT of the transmitter 410 of this embodiment.

The output signal OUT is detected by the power detection and control circuit 110, and compared with a control signal Vapc from the baseband circuit 113. A signal Vdet obtained as a result of the comparison is input to a control terminal of the VGA 107 or the power amplifier 109. In the GSM mode, the gain of the power amplifier is set using the signal Vdet, and in the EDGE mode, the gain of the VGA 107 is set using the signal Vdet, and the gain of the power amplifier 109 is controlled so as to assume a fixed value.

Because the output noises of the amplifiers 100-1 and 100-2 are suppressed by the LPFs 101-1 and 101-2, the principal noise sources of the transmitter 410 of this embodiment are the mixers 102-1 and 102-2, the ½ dividers 104-1 and 104-2, and the local oscillator 105. An attenuator is not connected between the mixer 102-1 or 102-2 and the power amplifier 109 to enable the realization of the low-noise transmitter 410. It is because, when an attenuator is used, a desired signal level is decreased, an S/N deteriorates and therefore the use of an attenuator is not suitable for a low-noise transmitter.

In the GSM mode, a noise specification is −162 dBc/Hz in the 20 MHz offset frequency from a desired signal, and in the EDGE mode, −156 dBc/Hz. Therefore, the specification in the GSM mode is stricter. Accordingly, a noise reduction in the GSM mode is important in particular. At this point, as described above, the limiter 106 enters an operating state in the GSM mode, and the VGA 107 enters the operating state in the EDGE mode.

That is, because the GMSK modulation used in the GSM mode is constant modulation, the low-noise transmitter 410 can be realized by decreasing an AM noise level in the 20 MHz offset frequency using the limiter 106. Further, to suppress a harmonic component included in the output signal of the MOD 111 using the LPF 101-3 is important especially in the GSM mode. When the harmonic component is not fully suppressed, a signal spectrum and modulation accuracy are deteriorated by nonlinear operation of the limiter 107. Further, when the noise levels of the mixers 102-1 and 102-2, the ½ dividers 104-1 and 104-2, and the local oscillator 105 are suppressed low, the filter for suppressing the noise can be either the LPF 101-3 or the BPF 108.

The main points of the invention in this embodiment are summarized as follows. First, the deterioration of an S/N is suppressed to the minimum by transmitting a signal to the power amplifier 109 without passing through an attenuator from the output of the MOD 111, and the realization of the low-noise transmitter 410 is enabled. Furthermore, the main points are to realize the low-noise transmitter 410 particularly when constant envelope modulation signal is used by switching and operating the limiter 106 and the VGA 107 respectively in accordance with the constant envelope modulation signal and non-constant envelope modulation signal. Because such a low-noise transmitter can be realized, an SAW filter need not be used in this embodiment. Accordingly, the IC integration of a circuit from the MOD 111 to the output amplifier 210 is simplified. Further, the circuit integrated into the RF-IC 112 is not limited to the example of this embodiment. For example, the power detection and control circuit 110 may also be integrated into the RF-IC 112.

Figure 2:
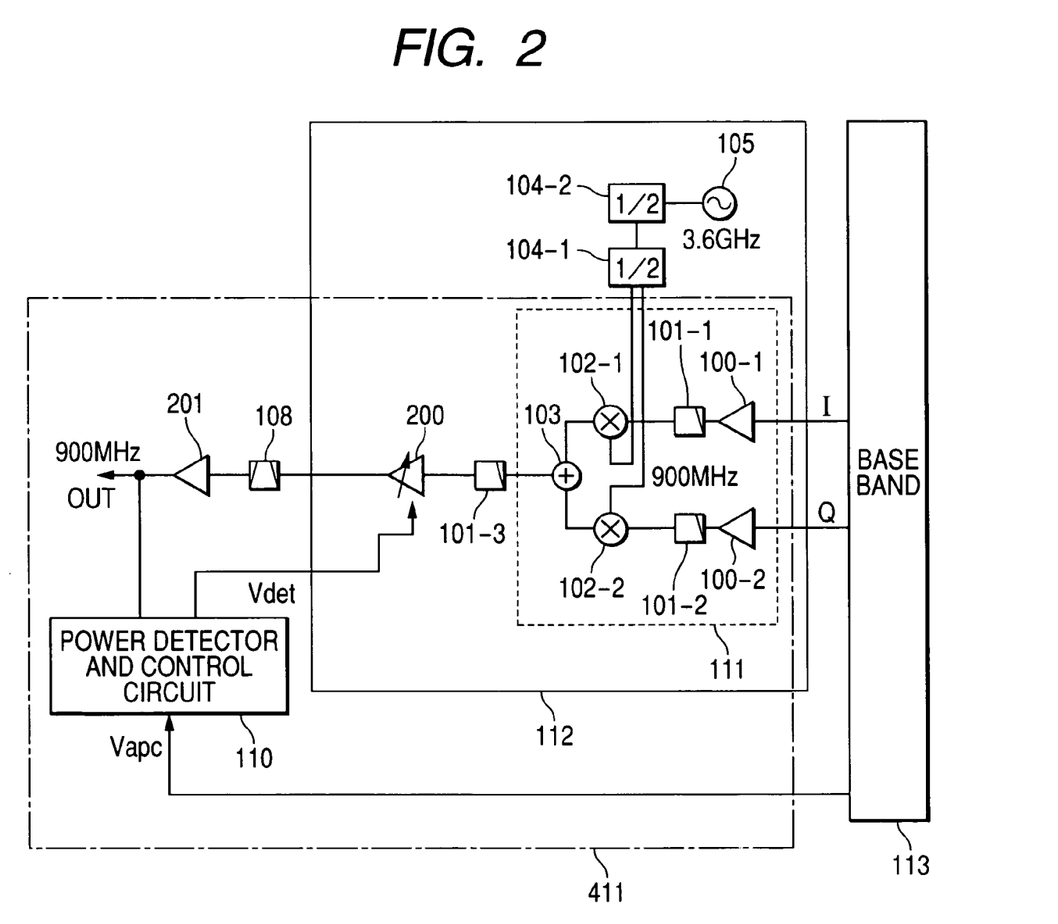
FIG. 2 is a block diagram for describing a second embodiment of the transmitter of the present invention.
Figure 3:
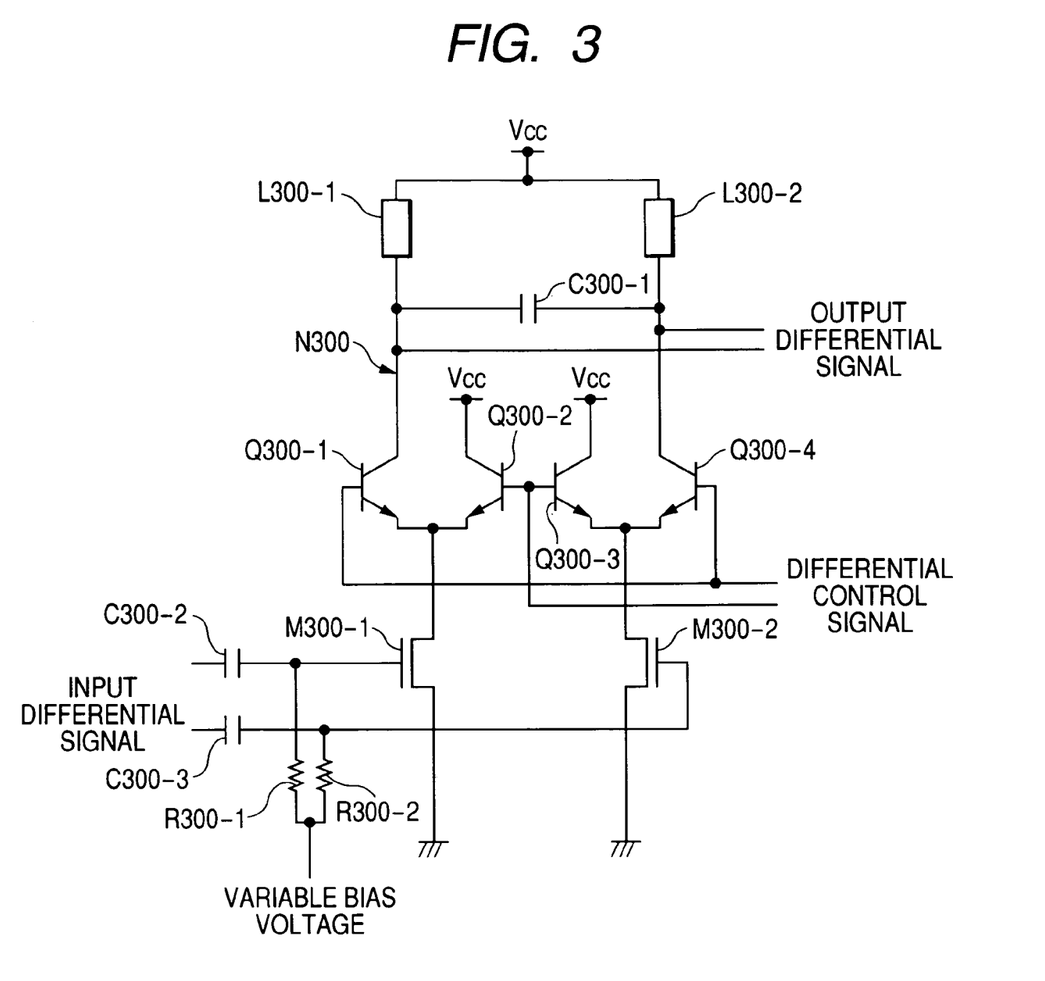
FIG. 3 is a circuit diagram for describing an example of a dual mode VGA used in the second embodiment.

FIG. 2 is a block diagram showing a second embodiment of a transmitter according to the present invention. A transmitter 411 of this embodiment removes the limiter 106 from the first embodiment, and replaces the VGA 107 with a dual mode VGA 200 that can switch linear operation and limiter operation depending on a mode, and the power amplifier 109 with a power amplifier 201 of a fixed gain. Accordingly, in this embodiment, the dual mode VGA 200 functions as an output amplifier. Further, the gain of the power amplifier 201 generally depends on a mode; however, the gain of the power amplifier 201 does not depend on the mode in this embodiment. In other words, in this embodiment, the gain of the power amplifier 201 is fixed. Accordingly, the power of the output signal of the power amplifier 201 is controlled by controlling the gain of the dual mode VGA 200 performed through the control voltage Vdet regardless of a mode. The dual mode VGA 200 performs the same linear operation as the VGA 107 in the EDGE mode, but performs the limiter operation to reduce a noise in the GSM mode. FIG. 3 shows an example of the dual mode VGA 200 that enables such operation.

The dual mode VGA 200 includes a bipolar transistor Q300, a MOS transistor M300, a capacitor C300, an inductor L300, and a resistor R300. An input differential signal that is the output signal of the LPF 101-3 is input to the gate of the MOS transistor M300 for voltage-to-current conversion through capacitors C300-2 and C300-3. A bias voltage of the MOS transistor M300 is supplied to the gate of the MOS transistor M300 through the resistor R300. A drain output current of the voltage-to-current converted MOS transistor M300 changes into collector output currents of bipolar transistors Q300-1 and Q300-4. The collector output current is converted into a voltage by the inductor L300 and the capacitor C300-1 that construct a load, and changes into an output differential signal.

The gain of the dual mode VGA 200 is controlled using a differential control signal supplied to the bipolar transistors Q300. For example, when the bipolar transistors Q300-1 and Q300-4 are set in an off state, and the bipolar transistors Q300-2 and Q300-3 are set in an on state, most of the collector output current of the MOS transistor M300 is input to the load. Accordingly, a gain is increased. Moreover, when the bipolar transistors Q300-1 and Q300-4 are set in the off state, and the bipolar transistors Q300-2 and Q300-3 are set in the on state, most of the collector output current of the MOS transistor M300 flows into a power supply Vcc, but is not input to the load. Accordingly, a gain is reduced.

In the EDGE mode, a sufficiently high voltage is input so that the voltage-to-current conversion in the MOS transistor M300 may become linear. Further, in the GSM mode, a low voltage is input as a bias voltage so that a limiter action may be generated by the voltage-to-current conversion.

Figure 4:
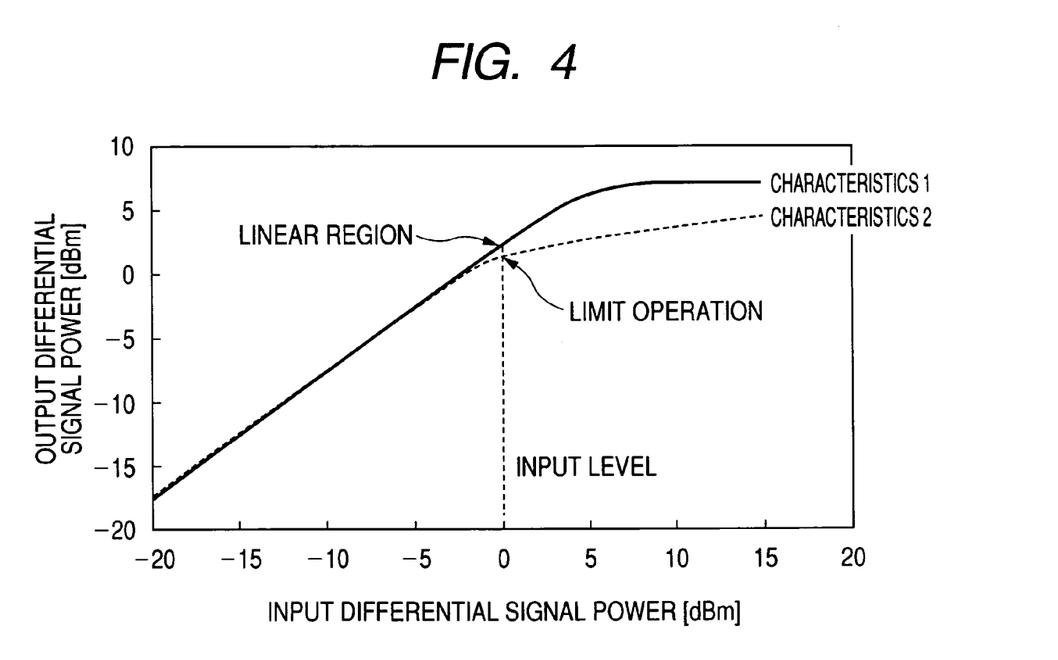
FIG. 4 is a curve diagram showing an example of input and output characteristics of the dual mode VGA.

FIG. 4 shows input and output characteristics obtained by simulation as an example of the characteristics of the dual mode VGA 200. The input differential signal power is 0 dBm in either mode. By adjusting a bias voltage, in the EDGE mode, the input and output characteristics turn into a characteristic 1, and linear operation is realized. On the other hand, in the GSM mode, the input and output characteristics turn into a characteristic 2, and limiter operation is realized.

[31] As described above, limiter operation is performed on the input side of the dual mode VGA 200, that is, by the MOS transistor M300. This is advantageous to the realization of a low-noise transmitter as compared with the case in which the limiter operation is performed on the output side of the dual mode VGA 200. It is assumed as a method for performing the limiter operation on the output side that a resistor is used instead of the inductor L300. However, when the inductor L300 is used, a signal at a connection point N300 between the inductor L300 and the bipolar transistor Q300-1 has amplitude that changes upward and downward centering around the voltage Vcc. On the other hand, when a resistor is used, because the amplitude of the signal only changes up to the maximum voltage Vcc centering around a lower voltage value than the voltage Vcc, output power is reduced, and an S/N decreases. Furthermore, the S/N decreases further due to thermal noise generated from the resistor.

The main points of the invention in this embodiment are summarized as follows. First, the deterioration of an S/N is suppressed to the minimum by transmitting a signal up to the power amplifier 109 without passing through an attenuator from the output of the MOD 111, and the lowering of noise in the transmitter 411 can be realized. Furthermore, the main points are to enable the realization of the low-noise transmitter 411 particularly when constant envelope modulation signal is used by changing the operation of the dual mode VGA 200 in accordance with the constant envelope modulation signal and non-constant envelope modulation signal.

Figure 5:
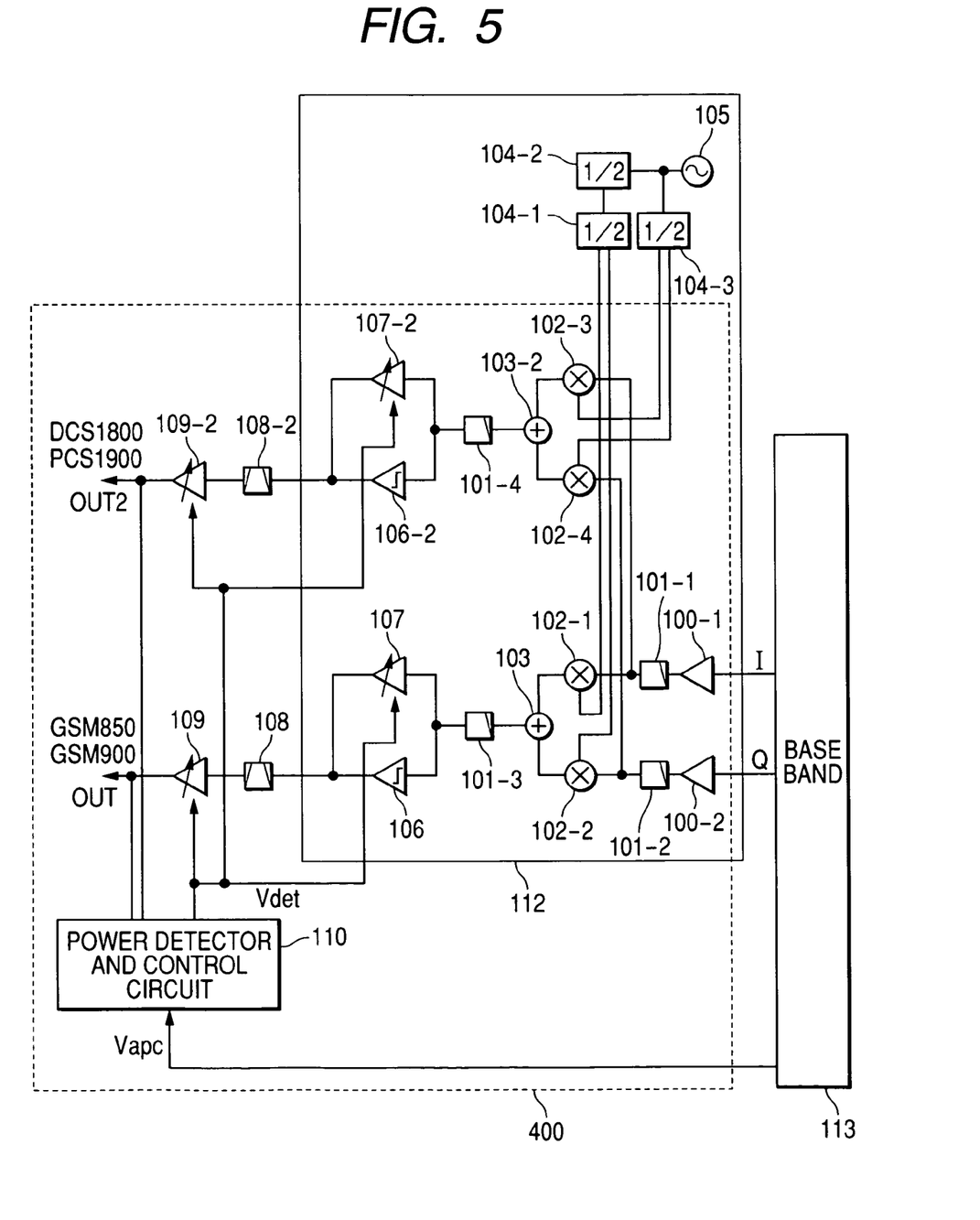
FIG. 5 is a block diagram for describing a third embodiment of the transmitter of the present invention.

Next, FIG. 5 is a block diagram showing a third embodiment of a transmitter according to the present invention. The transmitter 400 of this embodiment adds a ½ divider 104-3, mixers 102-3 and 102-4, an adder 103-2, an LPF 101-4, a VGA 107-2, a limiter 106-2, a BPF 108-2, and a power amplifier 109-2 to the transmitter of the first embodiment. Furthermore, the transmitter 400 can cope with four frequency bands, that is, 824 MHz to 849 MHz of a GSM 850, 880 MHz to 915 MHz of a GSM 900, 1,710 MHz to 1,785 MHz of a DCS (Digital Cellular System) 1800, and 1,850 MHz to 1,910 MHz of a PCS (Personal Communications Service) 1900, and two modes (GSM: GMSK modulation, and EDGE: 8-level PSK modulation).

The modulation bandwidth of the baseband signals I and Q in the GSM mode and the EDGE mode are equal, and accordingly the amplifier 100 and the LPFs 101-1 and 101-2 can be used in two modes in common.

The operation in the GSM 850 and the GSM 900 is the same as in the operation in the first embodiment. The baseband signals I and Q are output as the output signal OUT after a predetermined frequency is converted and amplified. Moreover, in the GSM mode, the limiter 106 operates, and the VGA 107 operates in the EDGE mode.

The operation in the DCS 1800 and the PCS 1900 is performed using the newly added mixer 102-3 and 102-4, adder 103-2, LPF 101-4, VGA 107-2, limiter 106-2, BPF 108-2, and power amplifier 109-2. The detailed operation is performed in the same manner as the GSM 850 and the GSM 900, and an output signal OUT2 is output.

The ½ divider 104-3 is used to generate a local signal used in the mixers 102-3 and 102-4. In the case of the DCS 1800 and PCS 1900, the output signal of the local oscillator 105 is divided into two in this manner. In the case of the GSM 850 and the GSM 900, the output signal is divided into four as described above. Accordingly, an oscillator frequency range necessary for the local oscillator 105 can be prevented from increasing by making the transmitter cope with the four frequency bands.

The advantage of this configuration is to enable the realization of a small area of the RF-IC 112 by sharing the amplifier 100 and the LPFs 101-1 and 101-2 in all frequency bands. In particular, the LPFs 101-1 and 101-2 are large in the area of a capacitor that constructs a filter because their cutoff frequency is as low as several hundreds kHz. Accordingly, the sharing of the LPFs 101-1 and 101-2 is effective for the realization of a small area.

The second advantage is to also enable circuit optimization on the output side of the LPFs 101-1 and 101-2 by individually providing a circuit in the low frequency bands (GSM 850 and GSM 900) and the high frequency bands (DCS 1800 and PCS 1900) respectively, and enable execution of the circuit optimization respectively, thereby facilitating setting of a low-noise transmitter or its low current consumption.

Figure 6:
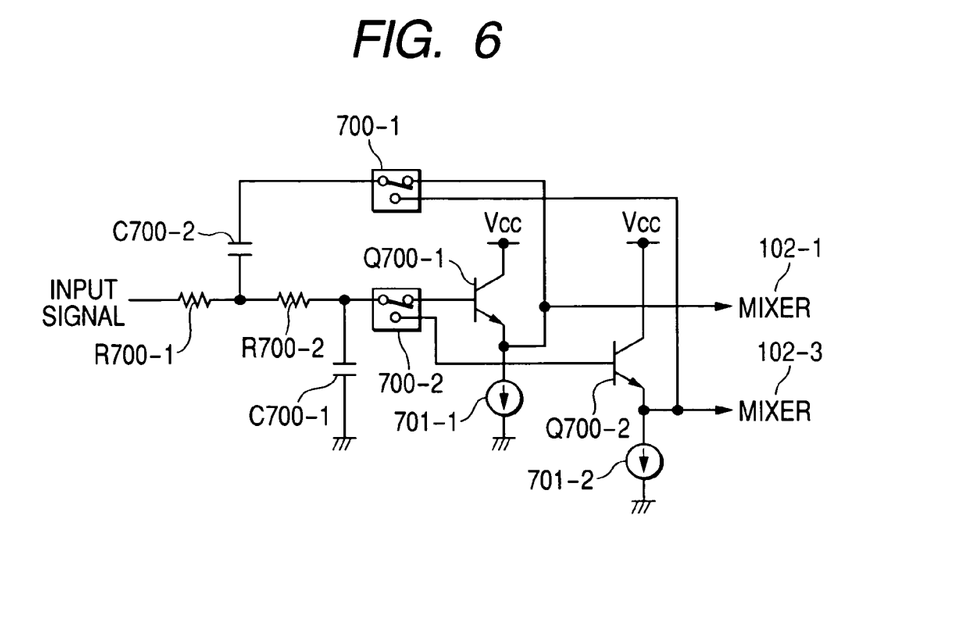
FIG. 6 is a circuit diagram for describing an example of an LPF used in the third embodiment.

FIG. 6 shows an example of the LPFs 101-1 and 101-2. Each of the LPFs 101-1 and 101-2 that uses the baseband signal amplified by an amplifier 100 as an input signal includes a resistor R700, a capacitor C700, a switch 700, a transistor Q700, and a current source 701. When the GSM 850 and the GSM 900 operate, the switch 700 operates so that the resistor R700, the capacitor C700, a transistor Q700-1, and a current source 701-1 may construct an active filter (Sallen-key type), and an output signal is output to the mixer 102-1. Moreover, when the DCS 1800 and PCS 1900 operate, the switch 700 operates so that the resistor R700, the capacitor C700, a transistor Q700-2, and a current source 701-2 may construct the active filter (Sallen-key type) in the same manner, and the output signal is output to the mixer 102-3. Thus, the capacitor C700, which becomes important to the realization of a small area in particular, can be used in all frequency bands. Further, the switch 700 can integrate an IC having a MOS transistor.

The LPF 101-3 of FIG. 5 can also be designed so that the frequency band may be changed according to the frequency bands (GSM 850 and GSM 900) or a transmitting frequency. In this case, the suppression level of an unwanted signal can be optimized per frequency band.

Figure 7:
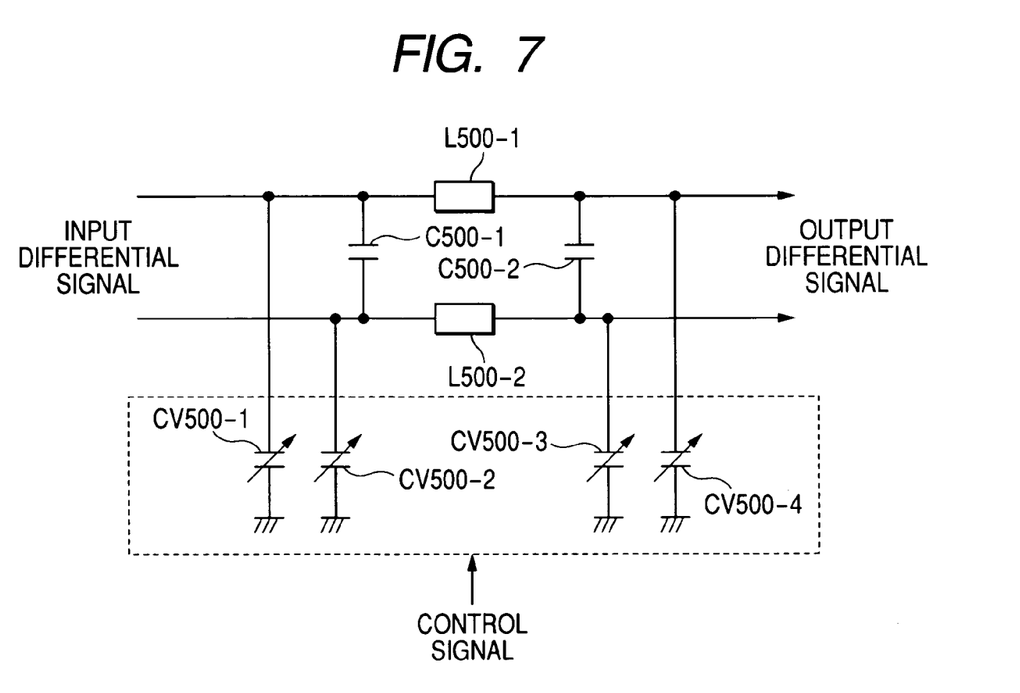
FIG. 7 is a circuit diagram for describing an example of a variable LPF used in the third embodiment.

FIG. 7 shows an example of the LPF 101-3, which is such a variable LPF. The LPF 101-3 includes an inductor L500, a capacitor C500, and a variable capacitor CV500. A capacitance value of the variable capacitor CV500 is determined using a control signal. The variable capacitor CV500 can be realized using a varactor, for example. Besides, the variable capacitor CV500 can be realized also by connecting a fixed capacitor with a switch in series, and controlling the on and off of the switch. Moreover, the LPF 101-3 can also be constructed using a resistor. Accordingly, the LFP 101-3 can use a passive filter having at least two elements among an inductor, a capacitor, and a resistor. Also with regard to the LPF 101-4, the frequency characteristic can be varied in the same way as the LPF 101-3.

Moreover, the BPF 108 in FIG. 5 can also be designed so that the frequency characteristic may be varied according to the frequency bands (GSM 850 and GSM 900) or a transmitting frequency. In this case, a suppression level or matching of an unwanted signal can be optimized per frequency band.

Figure 8:
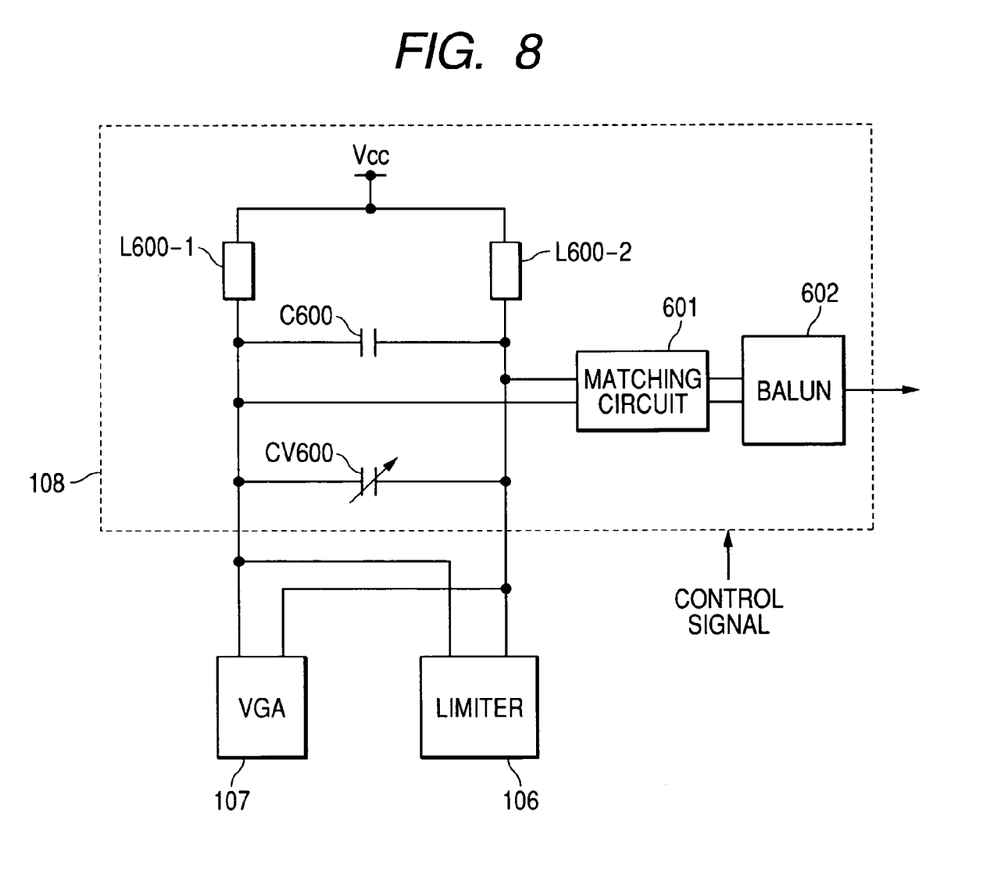
FIG. 8 is a circuit diagram for describing an example of a variable BPF used in the third embodiment.

FIG. 8 shows an example of the BPF 108, which is such a variable BPF. The BPF 108 includes an inductor L600, a capacitor C600, and a variable capacitor CV600. The BPF 108 of FIG. 8 has not only a bandpass characteristic but also serves as a load for the VGA 107 and the limiter 106. Furthermore, the BPF 108 also has the function as a matching circuit and a differential single conversion circuit by a matching circuit 601 and a balun 602 respectively. A frequency characteristic can be varied by changing a capacitance of the variable capacitor CV600 with a control signal. The variable capacitor CV600 can be realized using a varactor, for example. Besides, the variable capacitor can be realized also by connecting a fixed capacitor with a switch in series, and controlling the on and off of the switch. Moreover, the BPF 108 can also be constructed using a resistor. Accordingly, the BPF 108 can use a passive filter having at least two elements among an inductor, a capacitor, and a resistor. Also with regard to the BPF 108-2, the frequency characteristic can be varied in the same way as the BPF 108.

Figure 9:
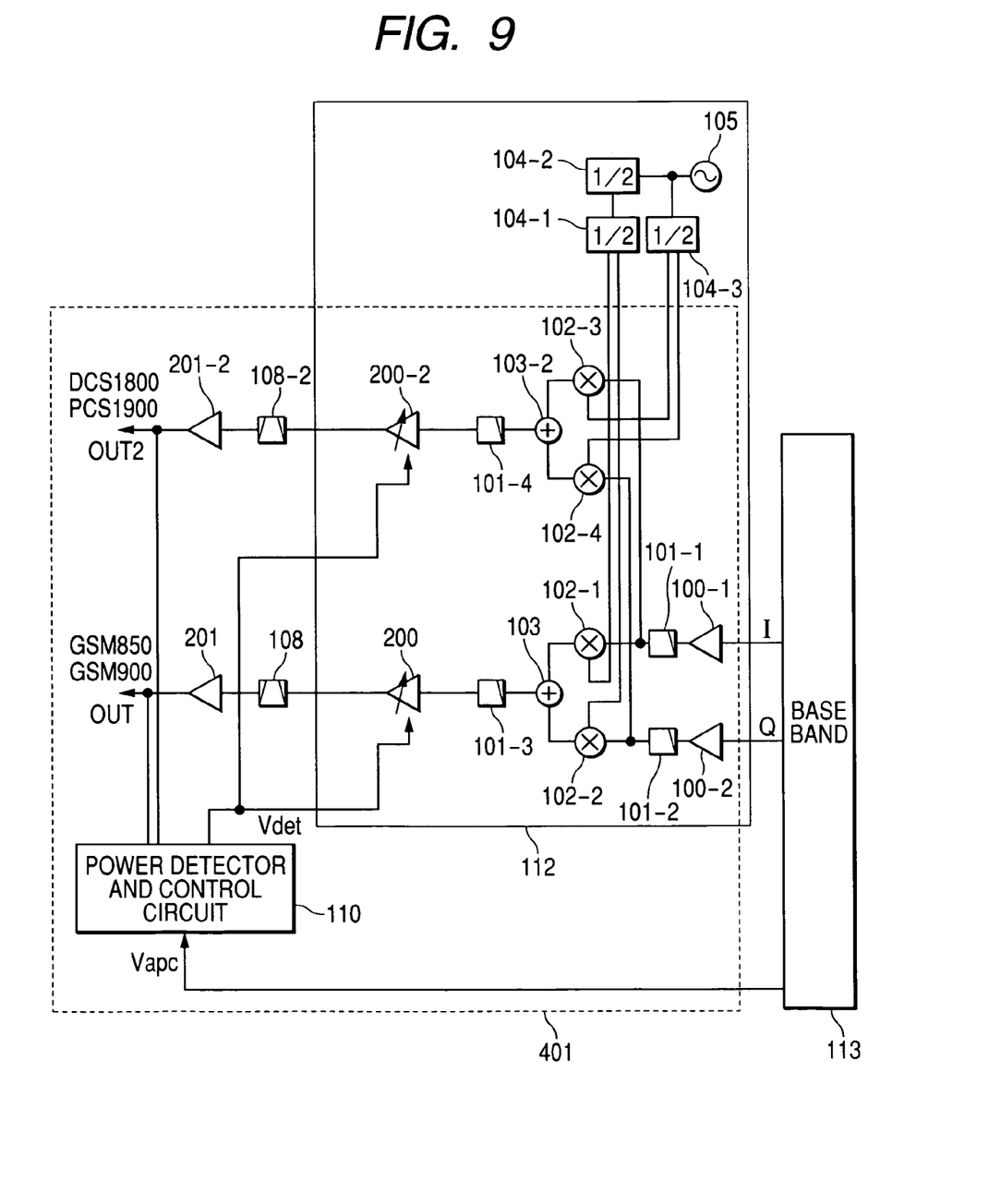
FIG. 9 is a block diagram for describing a fourth embodiment of the transmitter of the present invention.

Subsequently, FIG. 9 shows a fourth embodiment in which the second embodiment is extended using the same method that extends the first embodiment into the third embodiment, and in which the third embodiment copes with the four frequency bands (GSM 850: 824 MHz to 849 MHz, GSM 900: 880 MHz to 915 MHz, DCS 1800: 1,710 MHz to 1,785 MHz, and PCS 1900: 1,850 MHz to 1,910 MHz) and the two modes (GSM: GMSK modulation, and EDGE: 8-level PSK modulation).

The transmitter 401 of this embodiment switches the GSM 850/GSM 900 and the DCS 1800/PCS 1900 by the LPF 101-1 or 101-2. Moreover, the dual mode VGA 200 switches linear operation and limiter operation and controls a gain. The gain of the power amplifier 201 is fixed.

In this embodiment, noise is reduced in a transmitter noise is reduced when constant envelope modulation signal is used, which are the advantages of the second embodiment, and the RF-IC 112 is reduced in area and each circuit in a low frequency band and a high frequency band is optimized, which are the advantages of the third embodiment are realized.

Figure 10:
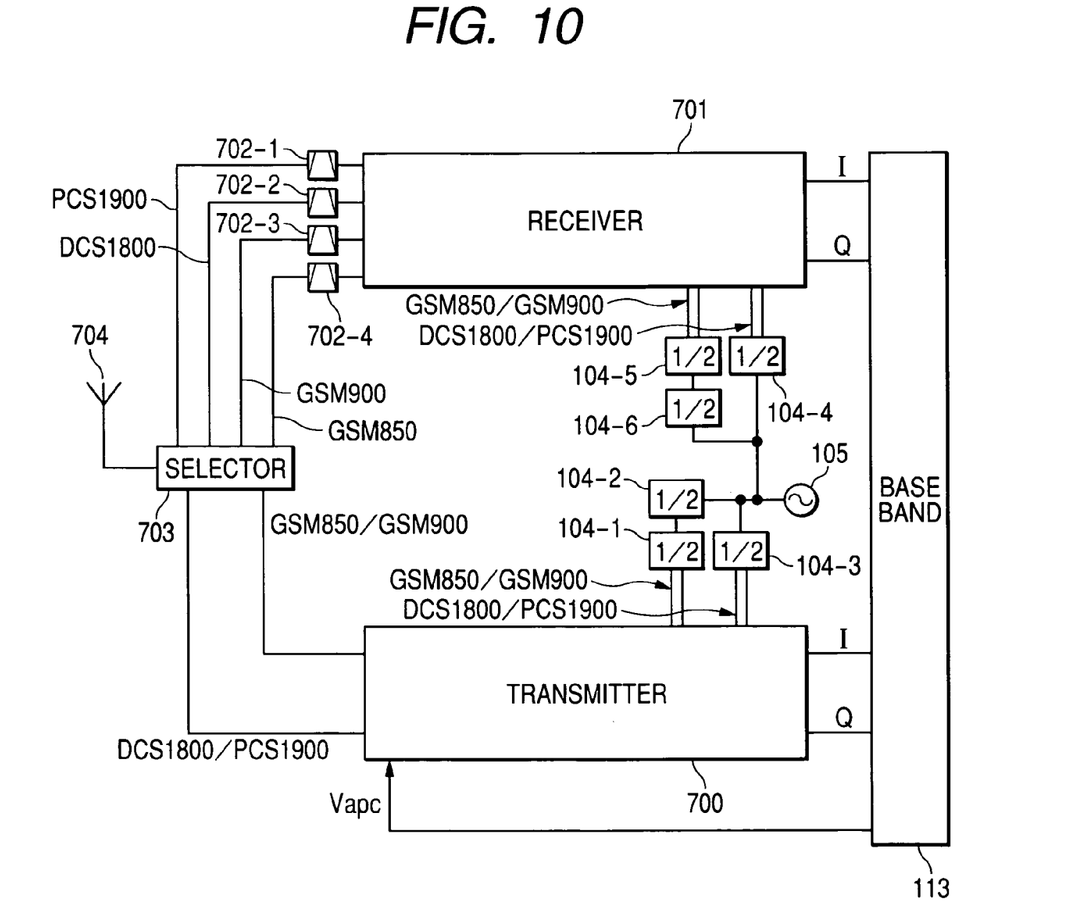
FIG. 10 is a block diagram for describing an embodiment of a wireless communication apparatus of the present invention.

Next, FIG. 10 is a block diagram showing an embodiment of a wireless communication apparatus according to the present invention. This embodiment copes with the four frequency bands (GSM 850: 824 MHz to 849 MHz, GSM 900:

880 MHz to 915 MHz, DCS 1800: 1,710 MHz to 1,785 MHz, and PCS 1900: 1,850 MHz to 1,910 MHz) and the two modes (GSM: GMSK modulation, and EDGE: 8-level PSK modulation).

The wireless communication apparatus of this embodiment includes a baseband circuit 113, the transmitter 700, a selector 703, an antenna 704, an SAW filter 702, and the receiver 701. Moreover, the local oscillator 105 and the ½ divider 104 are used as a circuit for supplying local signals of the transmitter 700 and the receiver 701. Further, in this embodiment, the local signals of the GSM 850/GSM 900 and the DCS 1800/PCS 1900 of the receiver 701 and the transmitter 700 are generated from the local oscillator 105 using the individual ½ divider 104 respectively. However, a local signal generation method is not limited to the foregoing method. Needless to say, the several ½ dividers 104 can also be shared.

The transmitter 700 is either the transmitter circuit 400 of the third embodiment or the transmitter circuit 401 of the fourth embodiment. Moreover, the receiver 701 uses a direct conversion method. Although not illustrated, the receiver 701 includes, as main circuits, a low-noise amplifier that amplifies a received signal from an antenna, and a quadrature demodulator that demodulates an output signal of the low-noise amplifier in quadrature and outputs the baseband signals I and Q.

The selector 703 is a circuit for properly connecting among the antenna 704, the SAW filter 702, and the transmitter 700 based on the reception mode, the transmission mode, and an operating frequency band.

In this embodiment, a low-noise wireless communication apparatus that can cope with two modulation formats of constant envelope modulation and non-constant envelope modulation is realized, and its downsizing and low cost are realized.

What is claimed is:

1. A wireless communication apparatus, comprising:
    a baseband circuit;
    a transmitter that uses a baseband signal outputted by the baseband circuit as an input signal, modulates the input signal by quadrature modulation, amplifies the modulation signal, and outputs a transmitted signal;
    an antenna that transmits and receives a radio wave;
    a receiver that demodulates a received signal from the antenna by quadrature demodulation, and outputs a baseband signal that corresponds to the received signal;
    a selector that supplies the transmitted signal outputted by the transmitter to the antenna, and supplies the received signal from the antenna to the receiver; and
    a local signal generation circuit that generates a local signal for use in the quadrature modulation performed by the transmitter and the quadrature demodulation performed by the receiver,
    wherein the transmitter comprises:
    a first quadrature modulator that modulates the input signal by quadrature modulation into a signal in which a frequency band is included in a first frequency band;
    a first amplifier that amplifies a modulation signal outputted by the first quadrature modulator;
    a second amplifier that amplifies an output signal of the first amplifier;
    a second quadrature modulator that modulates the input signal by quadrature modulation into a signal in which a frequency band is included in a second frequency band;
    a third amplifier that amplifies a modulation signal outputted by the second quadrature modulator; and
    a fourth amplifier that amplifies an output signal of the third amplifier by electric power,
    wherein each of the first amplifier and the third amplifier performs a limiting operation when a modulation format is constant envelope modulation, and performs a linear operation when the modulation format is non-constant envelope modulation,
    wherein a gain of each of the first amplifier and the third amplifier is controllable independently of a switching operation between the limiting operation and the linear operation,
    wherein, when operating in the first frequency band, the first quadrature modulator, the first amplifier, and the second amplifier enter an operating state and the second quadrature modulator, the third amplifier, and the fourth amplifier enter a non-operating state, and
    wherein, when operating in the second frequency band, the first quadrature modulator, the first amplifier, and the second amplifier enter the non-operating state, and the second quadrature modulator, the third amplifier, and the fourth amplifier enter the operating state.

* * * * *